United States Patent [19]

Sandhage

[11] Patent Number: 5,318,725
[45] Date of Patent: Jun. 7, 1994

[54] ELECTROCERAMICS AND PROCESS FOR MAKING THE SAME

[75] Inventor: Kenneth H. Sandhage, Columbus, Ohio

[73] Assignee: American Superconductor Corporation, Westborough, Mass.

[21] Appl. No.: 115,352

[22] Filed: Sep. 1, 1993

Related U.S. Application Data

[63] Continuation of Ser. No. 679,620, Apr. 3, 1991, abandoned.

[51] Int. Cl.$^5$ .................................. H01B 1/06
[52] U.S. Cl. .................... 252/520; 252/521; 428/699; 428/701
[58] Field of Search ............... 501/137; 423/598, 604, 423/608, 620, 636; 252/62.9, 520, 521; 264/65; 505/1, 736; 428/689, 692, 697, 699, 701, 702

[56] References Cited

U.S. PATENT DOCUMENTS 5,102,864 4/1992 Rapp et al. .......................... 505/1

FOREIGN PATENT DOCUMENTS 64-17318 1/1989 Japan .

OTHER PUBLICATIONS

"Preparation of High Tc . . . Alloy Powders" Yamada et al; Japanese Jrnl of Appl Phys. vol. 27, No. 5, (May 1988) pp. L802-L803.

"Preparation of High Tc . . . Alloy Ribbon in Air" Matsuzaki et al; Japanese Jrnl of Appl Phys. vol. 26 No. 4 (Apr. 1987) pp. L334-L336.

*Primary Examiner*—Karl Group
*Assistant Examiner*—Chris Gallo
*Attorney, Agent, or Firm*—Hale and Dorr

[57] ABSTRACT

Principal types of dielectric ceramics include capacitors, and piezoelectric electroptic and optical ceramics. The former are typically barium titanates, the latter, so-called PZT or PLZT materials. The ceramic materials are made by forming an alloy including the metallic elements in substantially stoichiometric proportions, and then oxidizing the alloy to produce the ceramic. In preferred embodiments, the alloy includes a dopant that is encapsulated in a noble metal, preferably silver. Preferred dielectrics are made by making a multi-layer structure in which a plurality of alloy layers (typically less than 20, and preferably less than 5, microns thick) are separated by conductive layers (preferably a noble metal), and then oxidizing the overall structure to form a multi-layer capacitor.

34 Claims, 2 Drawing Sheets

ELECTROCERAMICS AND PROCESS FOR MAKING THE SAME

This is a continuation of copending application Ser. No. 07/679,620, filed on Apr. 3, 1991, now abandoned.

FIELD OF INVENTION

This invention relates to electroceramics and, more particularly, to a process which permits the manufacture of dielectric, piezoelectric, electrooptic and optical ceramics in geometries and constructions not easily achieved with conventional ceramic processes.

BACKGROUND OF INVENTION

Four principal types of electroceramics are dielectrics, piezoelectrics, electrooptic and optical materials. Such electroceramics are used in such devices as capacitors, sensors, transducers, actuators, waveguides, and optical storage media. Barium titanate, often with additives such as liquid-phase sintering aids, grain growth inhibitors, stabilizers, and curie-point shifters, is a common material used for ceramic capacitors. Piezoelectric, electro-optic and optical devices are commonly made of lead zirconate titanate (often referred to as "PZT") or lanthanum-modified PZT (often referred to as "PLZT"), and other dopants or additives may be added to either system. Other previously used electroceramic compositions include bismuth titanate, lead niobate, sodium potassium niobate, lead titanate and other compounds including elements from columns IV-A and V-A of the periodic table.

The common method for producing ceramic oxide bodies involves blending the ceramic precursor (oxide, carbonate, etc.) powder with one or more of a solvent, dispersant, plasticizer and binder, forming a green body by tape casting or extrusion, and firing the green body so as to pyrolize the organic components, form the desired phases, and densify the body. A wide range of such compositions and the prior art methods by which they are prepared are discussed in some detail in *Ceramic Materials For Electronics Processing, Properties and Applications*, edited by Relva C. Buchanan and published by Marcel Dekker, Inc. of New York and Basel in 1986.

The different prior art processes are subject to various limitations. While the use of organic additions has aided in the shaping of green bodies, difficulties encountered during organic pyrolysis (e.g., non-uniform shrinkage, incomplete burnout, formation of stable carbonates) can make formation of dense, complex shapes with a desired microstructure difficult. In particular, there is needed a procedure which can be used to form non-planar geometries and constructions, e.g., coaxial or multi-layer bodies, or curved beam devices, and which can be used to make multi-layer capacitors and similar structures in which the individual ceramic layers are less than 20 microns (and preferably less than 10 micron) thick.

U.S. Pat. No. 4,826,808, which is also here incorporated by reference, discloses a method of producing a composite of superconducting oxide by first forming a precursor alloy which includes the metallic elements of the desired superconducting oxide and then oxidizing the alloy to form the complex superconducting oxide. The patent discloses mixing at least one "noble" metal element (e.g., a metal whose oxide is thermodynamically unstable under the reaction conditions employed) with the alloy elements, and then oxidizing the alloy-noble metal elements to form a structure in which a substantially pure noble metal phase is intimately mixed with the superconducting oxide.

SUMMARY OF THE INVENTION

The invention features preparing a dielectric, piezoelectric, electrooptic or optical ceramic oxide by combining metallic elements in substantially the stoichiometric proportions needed to form the oxide to form an alloy; and, thereafter oxidizing the alloy to form the oxide.

The elements combined in stoichiometric proportions typically include one element selected from the group consisting of column 1-A elements and column 2-A elements and a second element selected from the group consisting of column IV-A elements and column V-A elements; and most preferably include titanium and either (a) barium or (b) lead and zirconium.

An aspect of the invention involves making a multilayer dielectric, piezoelectric, electrooptic or optical ceramic oxide device either by forming a multi-layer structure that includes a plurality of layers of the alloy with a conductive layer between adjacent alloy layers and then oxidizing the alloy layers to transform them into oxide layers.

DETAILED DESCRIPTION

Figure 1:
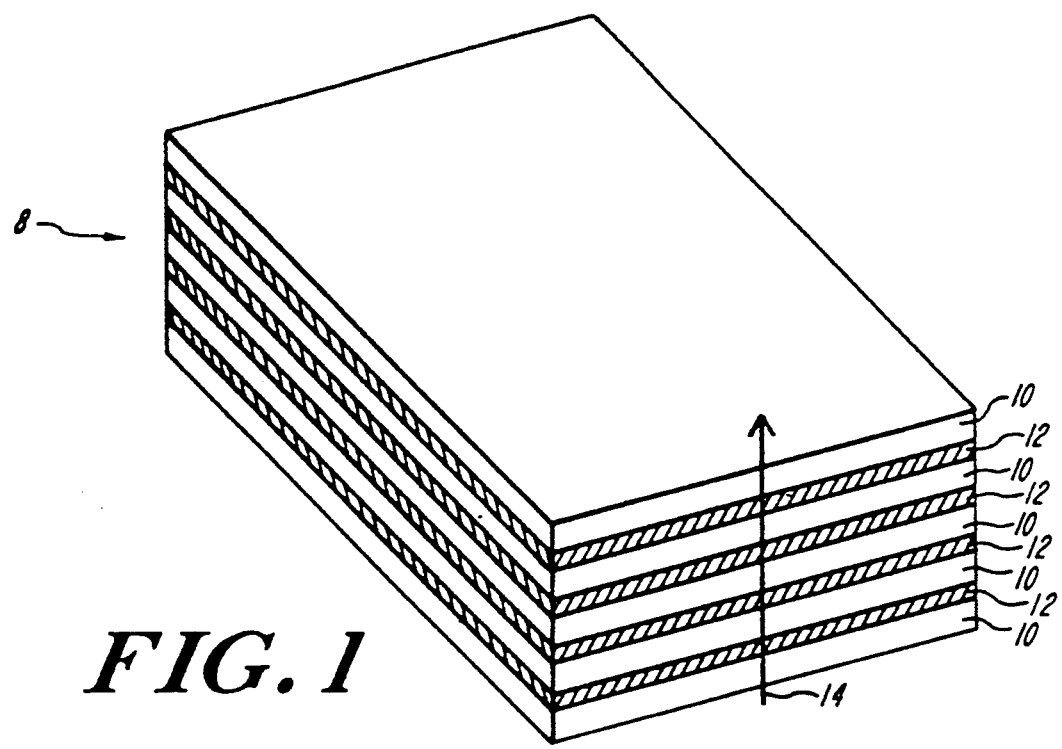
FIG. 1 is a schematic diagram of a micro-laminate structure having layers of a metal separated by layers of a ceramic oxide.

There are a large number of known electroceramic materials, including the following:

| Titanates/Zirconates | |
|---|---|
| $BaTi_4O_9$ | $(Ba_xSr_yLa_{1-x-y})TiO_3$ |
| $BaTiO_3$ | $Ba(Sn_xTi_{1-x})O_3$ |
| $SrTiO_3$ | $(Ba_xCa_{1-x})(Zr_yTi_{1-y})O_3$ |
| $CaTiO_3$ | $(Ba_xSr_yCa_{1-x-y})(Zr_yTi_{1-y})O_3$ |
| $PbTiO_3$ | $Pb(Zr_xTi_{1-x})O_3$ |
| $BaZrO_3$ | $(Pb_xLa_{1-x})TiO_3$ |
| $SrZrO_3$ | $(Pb_ySr_{1-y})(Zr_xTi_{1-x})O_3$ |
| $CaZrO_3$ | $(Pb_yLa_{1-y})(Zr_xTi_{1-x})O_3$ |
| $PbZrO_3$ | $(Ba_xPb_{1-x})TiO_3$ |
| $(Ba_{1-x}Sr_x)TiO_3$ | $(Ba_xPb_yLa_{1-x-y})TiO_3$ |
| Niobates | |
| $Pb(Zn_xNb_{1-x})O_3$ | $Pb(Mg_xZn_{1-x})_yNb_{1-y}O_3$ |
| $Pb(Fe_xNb_{1-x})O_3$ | $Pb(Sc_xNb_{1-x})O_3$ |
| $Ba(Zn_xNb_{1-x})O_3$ | $LiNbO_3$ |
| $Pb(Ti_xNb_{1-x})O_3$ | $KNbO_3$ |
| $Pb(Mg_xNb_{1-x})O_3$ | |
| Tungstates | |
| $Pb(Fe_xW_{1-x})O_3$ | $Pb(Mg_xW_{1-x})O_3$ |
| $Pb(Ni_xW_{1-x})O_3$ | $Pb(Li_xFe_yW_{1-x-y})O_3$ |
| Ferrites | |
| $BaFe_{12}O_{19}$　　$SrFe_{12}O_{19}$ | $CaFe_{12}O_{19}$ |
| Tantalates | |
| $Pb(Sc_xTa_{1-x})O_3$　$Ba(Zr_xZn_yTa_{1-x-y})O_3$ | $Ba(Sn_xMg_yTa_{1-x-y})O_3$ |

As is well known in the art, these materials are often doped to give the final material desired characteristics that are not found, or are found to only a considerably less degree, in the undoped material. For example, known dopants to barium titanate for various purposes include:

liquid-phase sintering aids: borate fluxes ($CdO-Bi_2O_3-PbO-B_2O_3$), borosilicate fluxes ($CdO-Bi_2O_3-PbO-ZnO-B_2O_3-SiO_2$), LiF, $CuO-TiO_2-ZrO_2$ fluxes, $Al_2O_3-SiO_2$, $B_2O_3$, CuO, $Pb_5Ge_3O_{11}$ grain-growth inhibitors: $Y_2O_3$, $ZrO_2$, $Dy_2O_3$ Curie-point shifters: SrO, CaO, $SnO_2$, PbO, $CaZrO_3$, $Bi_2O_3$, $ZrO_2$ enhancing the PTCR effect: $MnO_2$, $Cr_2O_3$, $Nb_2O_5$, stabilization against dielectric breakdown: $Bi_2O_3$, $Nb_2O_5$, $UO_3$ flattening the permittivity-temperature relation: NiO, $Bi_2(SnO_3)_3$, $CaZrO_3$, $CaSnO_3$, $SrTiO_3$, $CaTiO_3$, $MgSnO_3$ Similarly, lead zirconate titanate (PZT) ceramics are almost always used with a dopant, modifier or other composition in solid solution to improve the properties of the basic PZT material. Typical modifiers are donor additives such as $Nb^{5+}$, acceptor additives such as $Fe^{3+}$, and isovalent additives such as $Ba^{2+}$ or $Sr^{2+}$.

A PZT-based compositional system that embraces both piezoelectric and electroptic materials is the lanthanam-modified system known as PLZT. In it, lanthanam ions replace lead ions. For piezoelectric compositions the material typically contains less than 5% La; for electrooptic ceramics the amount of La is typically 6% or more.

According to the present invention, ceramic oxide materials are produced using a metallic precursor approach that presents several advantages over conventional ceramic processing methods that involve organic additions. Metals or alloys can generally be deformed, cast, or deposited into a variety of complex shapes that are difficult if not impossible to achieve using conventional "green-ware" processing. Further, since certain alkaline-earth metal bearing alloys exhibit relatively small volume changes upon oxidation, the metallic precursor approach makes near-net-size-and-shape processing possible. This is in particular contrast to ceramic approaches involving organic additions in which significant shrinkage occurs upon removing the organic components.

Additionally, metal precursor alloy bodies can be oxidized at atmospheric pressure at relatively low (e.g., often less than 1100° C.) temperatures. This makes it possible to obtain a relatively fine (submicron to a few microns) oxide grain structure, which in turn allows for complete sintering at relatively low temperatures and relatively short times, leading to the production of dense oxide bodies of controlled grain size.

The low sintering temperatures are of particular desirability in applications in which metal electrodes are used to make contact to the ceramic oxide. For example, a lower sintering temperature permits the use of less expensive electrodes in multi-layer capacitors (e.g., silver-palladium alloys with less palladium or silver-platinum alloys with less platinum can be used). Nickel or copper electrodes may also be used at lower temperatures, owing to decreased reactivity of nickel or copper oxides with the dielectric ceramic.

The absence of organic additions also reduces the amount of carbon present, making it possible to avoid the production of undesirable stable carbonates and to employ unique reaction paths that do not involve carbonate reactions.

The first step in the practice of the present invention is to obtain the desired, typically stoichiometric, quantities of each of the metal elements of the desired compound. This is typically accomplished by calculating the weight of the desired amount of each element, and then weighing out that desired amount.

If, for example, the desired ceramic oxide is barium titanate, the barium and titanium elements are present in a 1:1 molar ratio; or, on a weight basis, in the ratio of 137.4 grams of barium to 47.9 grams of titanium. Thus, if a 1000 gram alloy is desired, 743 grams [i.e., $1000 \times (137.4)/(137.4+47.9)$] of barium and 257 grams [i.e., $1000 \times (47.9)/(137.4+47.9)$] of titanium are weighed out for mixing together.

Similarly, if the desired ceramic oxide is lead zirconate titanate, the lead, zirconium and titanium elements are present in a 1:x:1−x ratio; or on a weight basis, 207.21 grams of lead to 91.22x grams of zirconium, to $(1-x)$ (47.90) grams of titanium, x being the desired fraction of lead zirconate. Thus, if a ceramic oxide that is 60% lead zirconate/40% lead titanate is desired, a 1000 gram metal element mixture will contain 737 grams of lead, 195 grams of zirconium, and 68 grams of titanium.

In any event, the particular composition of the desired ceramic oxide will be known in advance to those skilled in the art; and procedures for determining the required weights and amounts of the various desired metal elements are known and familiar to skilled chemists and materials scientists.

The second step is to form the metal elements into a metal alloy precursor that contains the proper ratio of the desired elements. This can be accomplished in a number of different ways, e.g. a solid-state metallurgical technique such as mechanical alloying, a liquid-state technique such as melt alloying, or a vapor-state technique such as vapor deposition. See *Metals Handbook*, Volume 2, "Properties and Selection: Nonferrous Alloys and Pure Metals", A.S.M., Ninth Edition, 1979, Metals Park, Ohio; and *Metals Handbook*, Volume 7, "Powder Metallury", A.S.M., Ninth Edition, 1979, Metals Park, Ohio. The alloy body may be formed into a variety of shapes, either during the alloying process or afterward.

In one procedure, for example, the metal element powders are placed in a noble metal (e.g., silver) tube, and the tube formed into an elongated wire-like or tape-like shape by means of one or more cross-section reducing operations (e.g., by one or more passes through a wire drawing die or rolling apparatus). In a somewhat similar procedure, which is particularly useful if one or more of the metal elements is ductile and will deform plastically, a foil of the ductile element (e.g., titanium) is wrapped around the other element(s) (e.g., barium rod or powder), and the foil/rod-powder extruded and pressed. Typically, the titanium foil/barium rod-powder is itself sealed within a closed noble metal tube before extruding.

The shaped metal alloy precursor is then oxidized to yield the desired ceramic oxide. Oxidation may be accomplished by heating the metal alloy precursor in an oxidizing atmosphere, by electrochemically oxidizing the metal alloy precursor with an electric potential, or by heating the metal alloy precursor in the presence of an easily-reduced solid or liquid oxidizing agent (i.e., using solid-state or liquid-state redox reactions). A silver tube is relatively permeable to oxygen, so a metal alloy precursor within such a tube will be oxidized when the entire tube/alloy structure is placed in an oxidizing environment.

In many instances, the oxidation process will proceed at relatively low temperatures and under atmospheric conditions. For example, barium oxidizes rapidly above about 200° C. in oxygen, and titanium oxidizes rapidly in oxygen above about 500° C. A barium-titanium alloy has been found to oxidize rapidly in oxygen at a temperature of about 900° C., i.e., at a temperature somewhat below that required for rapidly oxidizing titanium alone.

Herein, the term "oxidation" is used in a generic, electrochemical sense. It refers to any process by which the valence state of an element or ion is increased. The term "noble metal" is used to refer to any metal that will not oxidize under the conditions that are then being used to oxidize other metal element components of the alloy. For example, a metal alloy precursor including barium, titanium and silver may be oxidized under proper conditions of oxygen fugacity and temperature to yield barium titanate ($BaTiO_3$) and Ag. In this case, silver is a "noble metal", because it did not oxidize during the formation of the barium titanate.

FIG. 1 discloses a multi-layer microlaminate 8 including thin layers 10 of substantially pure metal separating substantially pure thin layers 12 of ceramic oxide. Each of the ceramic oxide and metal layers is not more than approximately 20 microns (and preferably less than about 5-10 microns) thick.

Microlaminate 8 may be constructed in a number of different ways.

According to one preferred method, the laminar microstructure is produced by oxidation of a metal alloy precursor 50 that includes (i) the non-noble metal elements (e.g., Ba, and Ti in a 1:1 molar ratio) of the desired ceramic oxide that will form layers 12 and (ii) a noble metal element (e.g., Ag or Cu) that will form layers 10.

It is known that oxidation of an alloy containing a relatively noble base metal (e.g., Ag, Cu) and a small amount of less noble alloy element can result in the formation of discrete oxide particles in a matrix of the noble metal. See, e.g., F. N. Rhines, and A. H. Grobe, "Internal Oxidation in Dilute Alloys of Silver and of Some White Metals," *Trans. Amer. Inst. Mining and Metall, Eng.,* Vol. 147, pg. 318, 1942; J. L. Meijering, and m. J. Druyvesteyn, "Hardening of Metals by Internal Oxidation," *Phillips Res. Rep.,* Vol. 2, pp. 81, 260, 1947; J. L. Meijering, "Storungslinien und Storungsbander in innerlich oxydierten Kupferund Silberlegierungen," *Z. Elektrochem.,* Vol. 63, pg. 824, 1959; R. A. Rapp, "Kinetics, Microstructures, and Mechanism of Internal Oxidation-Its Effect and Prevention in High Temperature Alloy Oxidation," *Corrosion,* Vol. 21, pg. 382, 1965; and R. A. Rapp, D. F. Frank, and J. V. Armitage, "The Formation of Passivating Internal $In_2O_3$ Bands in Silver-Indium Alloys," *Acta Metall.,* Vol. 12, pg. 505, 1964, all of which are here incorporated by reference. This process is known as internal oxidation. This type of oxidation is distinguished from exclusive external oxidization in which a layer of the solute element is formed at the external surface.

As disclosed in the above-referenced co-pending application, internal oxidation processes can also be used to produce, for example, a laminated microstructure consisting of layers of the desired ceramic oxide, e.g., $BaTiO_3$, between layers of essentially pure silver. The microstructure is made from a metal alloy precursor containing the elements Ba, Ti and Ag in the molar ratio Ba:Ti:Ag=1:1x (where x>0).

Figure 2:
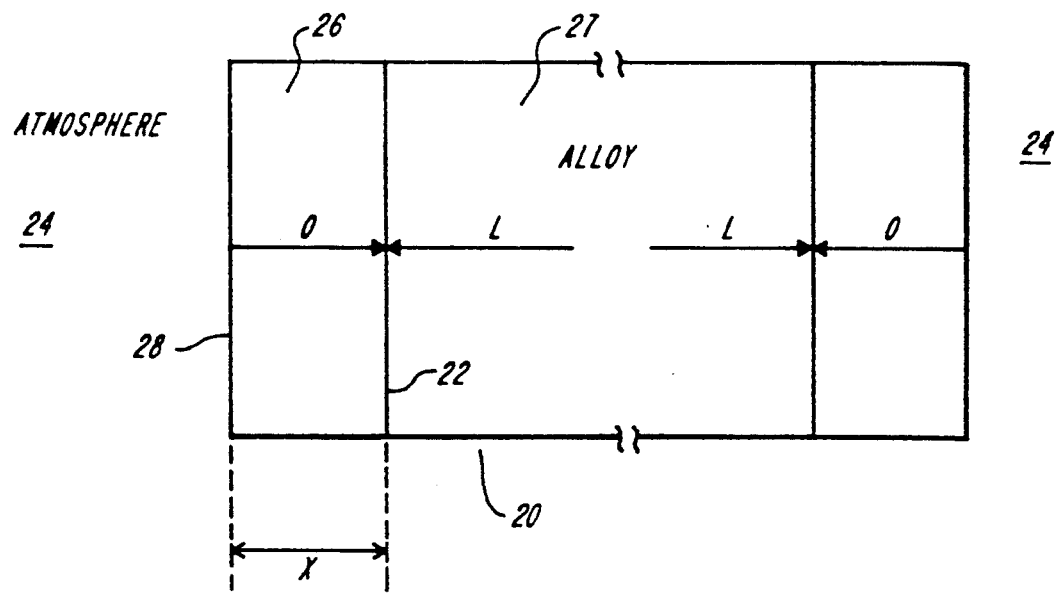
FIG. 2 is a cross-section of a metal alloy undergoing internal oxidation.

With reference to FIG. 2, the metal elements which will form the desired ceramic oxide (e.g., Ba and Ti if the desired oxide is $BaTiO_3$) have a high affinity for reacting with oxygen and rapidly diffuse through the precursor alloy at sufficiently high temperatures. Silver, on the other hand, is noble (e.g., will not oxidize above 200° C. in pure oxygen at 1 atmosphere pressure). Layers of dense oxides of the non-noble metals (e.g., Ba, Ti) separated by layers of the noble metal (e.g., Ag, Cu) may be formed within the precursor body by selectively alternating the environment (oxygen, partial pressure, temperature) surrounding the precursor.

As disclosed in the co-pending application, to form layers of ceramic oxide within the precursor, the temperature surrounding the precursor is increased causing oxygen from the atmosphere to dissolve into the metal alloy precursor at the external surface 28 and diffuse inward through the precursor. The atmosphere 24 which supplies the oxygen may be either a gas, liquid or solid. As the oxygen moves forward into the precursor, it encounters and reacts with the less noble elements Ba and Ti: to form $BaTiO_3$. As these less noble elements convert to oxides, the concentration of the remaining metallic, nonoxidized elements Ba, Ti in the region 26 drop relative to the concentration in the rest of the alloy 27. The resulting concentration gradient induces additional quantities of the less noble elements in the region 20 to diffuse outward toward the incoming oxygen thereby supplying additional metal for reacting with the oxygen.

At the reaction front 22, the outwardly diffusing less noble elements Ba, Ti meet the incoming oxygen and react to form oxides. Depending on the rate of outward diffusion of the less noble elements in relation to the rate of inward diffusion of the oxygen, the front 22 may possess varied concentrations of oxide particles. If the non-noble elements diffuse relatively rapidly enough, the reaction front 22 may possess a high concentration of oxide particles.

If the temperature and/or oxygen pressure are abruptly changed, a sudden change will result in the concentration of oxide particles at the reaction front. A sudden increase in temperature will increase the concentration of oxide particles at the reaction front in silver-based alloys, while it would decrease the concentration of oxide particles at the reaction front in copper-based alloys. If the concentration of the solute metal is sufficiently high, a transition from the formation of separate oxide precipitates at the reaction front to the formation of a continuous layer of oxide can occur.

It will thus be seen that, by introducing periodic, sudden changes in the temperature and/or oxygen pressure during the internal oxidation of a solid-solution alloy, it is possible to produce periodic changes in the concentration of oxide particles in the base metal matrix. Regular changes in temperature and/or oxygen pressure during internal oxidation (a process referred to as oscillating oxidation) results in alternating layers of dense and spare oxide concentrations.

For example, if a metal alloy precursor containing the elements Ba, Ti and Ag in the molar ratio of Ba:Ti:Ag=1:1:x (x>1) is oxidized under conditions at which the silver is noble (e.g., at temperatures above 200° C.), alternating cycles of low-oxygen-pressure-and/or-high-temperature and high-oxygen-pressure-and/or-low temperature can be used to form alternating layers with high and low concentrations of oxides, respectively, of Ba and Ti. After a number of cycles are conducted to form the desired number of layers, the body then can be further heat treated to form $BaTiO_3$. The $BaTiO_3$ phase will retain the laminar structure of the Ba and Ti oxides prior to forming $BaTiO_3$.

As another example, a $BaTiCu_x$ alloy precursor can be oxidized under conditions that will keep the Cu unoxidized while allowing for Ba and Ti to oxidize, (e.g., the oxygen pressure can be varied from a low value to a higher value and/or the temperature can be varied from a low value to a higher value) so as to produce alternating layers with high and low concentrations of Ba, Ti oxides, respectively. The intermediate body can then be heat-treated so as to form $BaTiO_3$.

According to a second preferred method, layers of a metal alloy precursor that, when oxidized, will produce the desired ceramic oxide are placed between alternating layers of a noble metal (e.g., silver), and the entire layered structure is then placed within a silver tube and subjected to repeated cross-section reduction operations (e.g., repeatedly extruded or passed between rollers) to reduce the thickness of the various layers. The reduced cross-section device is then placed in a furnace and heated in oxygen (typically at atmospheric pressure) for a period of time dependent on the layer thickness and particular alloy composition, to oxidize the metal alloy layers to form oxide layers 12. As earlier discussed, the noble metal layers 10 do not oxidize but remain in a substantially pure metal phase.

Preferred embodiments of the present invention are further described by way of the following examples.

EXAMPLE 1

Ba and Ti were mechanically-alloyed, in the molar ratio Ba:Ti=1:1, by gradually ball-milling Ba granules (less than 3 mm in diameter) along with fine Ti powder (~200 mesh) in a high-energy ball mill. The following ball-milling sequence, conducted in a stainless steel vial with stainless steel balls, was used: 1.29 grams of Ti+0.48 g of Ba, milled for 1.5 hours; 1.02 grams of additional Ba were added, milled for 64 hours; 1.39 more grams of Ba were added, milled for 48 hours; a final addition of 0.85 grams of Ba were added and milled for 24 hours (total milling time was about 138 hours). 2.32 grams of fine powder (i.e., the metal alloy precursor) were removed, out of a total of 5.03 grams added (yield=46%). Some of the powder was pressed into 3 mm diameter pellets. The pellets were heated at 2° C./min in oxygen to 900° C., and then held at this temperature for 50 hours. X-ray powder diffraction indicated that the oxidized metal possessed the $BaTiO_3$ structure.

EXAMPLE 2

A metal alloy precursor was formed by wrapping 1.16 grams of Ti foil (1.25 mils thick) around 3.35 grams of square-cross-section Ba rod (0.6×0.6×1.9 cm). This assemblage was packed inside a one-end-closed silver tube. The open end of the silver tube was sealed by the following method. Titanium foil was placed on top of the Ti-wrapped Ba rod. Silver powder was then packed on the titanium foil, oxide powder was packed on the silver powder, and a copper disk was placed on the oxide powder. The silver tube was sealed by brazing the copper disk to the walls of the silver tube. The sealed tube was then hydrostatically extruded at 300° C. into a 0.3 cm diameter rod; and a 1.5 cm length of this rod was then warm-pressed (300° C.) to a thickness of 0.1 cm. Optical metallography of a cross-section of the pressed metallic precursor revealed a Ba-Ti core thickness of about 200 microns. The pressed piece was then heated in oxygen in 10° C./min to 900° C., and held at 900° C. for 25 hours. Electron microprobe analysis of a cross-section of the pressed piece after heat treatment revealed that the Ba-Ti core had been completely oxidized. The phases detected included $Ba_2TiO_4$, $Ba_4Ti_{13}O_{30}$, $Ba_2Ti_9O_{20}$, and $TiO_2$.

EXAMPLE 3

A metal PZT ceramic material (lead zirconium titanate) may be prepared as follows.

Figure 3A:
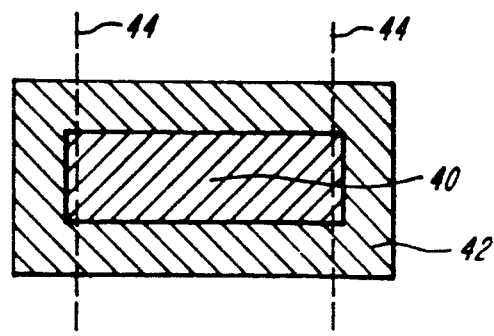
FIGS. 3a and 3b are cross-sectional views of devices in an intermediate stage of manufacture.

A $Pb_1Zr_{0.6}Ti_{0.4}$ alloy is prepared by mechanically alloying Pb, Zr, and Ti powders (73.7 wt % Pb, 19.5 wt % Zi; 6 wt % Ti) in a high-energy ball mill. As shown in FIG. 3a, the alloy 40 is packed into a silver tube 42, which is then sealed.

The packed tube is deformed into a round cross-section wire (by extrusion, wire drawing, and swaging). The wire is then rolled into a flat tape. The silver on the short edges of the rectangular cross-section can then be mechanically removed (along dashed lines 44 in FIG. 3a) so as to isolate the silver layers from each other. The tape is then oxidized in a pure oxygen atmosphere at a temperature below 931° C., so as to form a $Ag/Pb(Zr_{0.6}Ti_{0.4})O_3$ laminated composite.

EXAMPLE 4

A PZLT ceramic may be prepared following the procedure described in Example 4, except that essentially pure lanthanam is added to the powder mix in an amount equal to about 4% (by weight) of the total of the other three metal components, thereby producing a powder including all four metal elements.

EXAMPLE 5

A $Pb_1Zr_{0.6}Ti_{0.4}$ alloy may be prepared by melting Pb, Zr, and Ti in an inert atmosphere at temperatures in excess of 1300° C. The molten alloy is then rapidly solidified by casting the molten alloy onto a spinning wheel so as to form metal precursor ribbons. The ribbons are then ground into powder by a ball mill. The alloy powder is packed into a silver tube, which is then sealed.

The packed tube is deformed into a round cross-section wire, by extrusion, wire drawing, or swaging (or a combination of extrusion and wire drawing). The wire is then oxidized in a pure oxygen atmosphere at a temperature below 931° C., so as to form a $Ag/Pb(Zr_{0.6}Ti_{0.4})O_3$ composite body. The silver on one pair of edges of the rectangular cross-section can then be mechanically removed so as to isolate the silver layers from each other.

EXAMPLE 6

A $Pb_{0.96}La_{0.03}Zr_{0.8}Ti_{0.2}$ metal alloy may be prepared by depositing a metal alloy film onto a substrate by sputtering from a Pb-La-Zr-Ti-bearing target (or from multiple targets). A silver layer is then deposited onto the $Pb_{0.96}La_{0.03}Zr_{0.8}Ti_{0.2}$ film by sputtering from a silver target. Another layer of $Pb_{0.96}La_{0.03}Zr_{0.8}Ti_{0.2}$ is deposited by sputtering onto the silver layer, and the deposition process is continued in this manner until a multilaminate body with a desired number of silver and $Pb_{0.96}La_{0.03}Zr_{0.8}Ti_{0.2}$ layers are obtained.

The multilaminate body is then oxidized in oxygen at a temperature below 931° C., so as to form a multilaminate Ag/Pb$_{0.96}$La$_{0.03}$Zr$_{0.8}$Ti$_{0.2}$O$_3$ composite body.

The device of Example 6 is a multilaminate, multilayer body multifilamentary wires may also be prepared as discussed in Example 7.

EXAMPLE 7

An alloy of Ba$_{1-x}$Ti$_1$A$_x$ or Ba$_1$Ti$_{1-x}$A$_x$ where A is an acceptor dopant (e.g., substitution of Na$^{+1}$ for Ba$^{+2}$ or; substitution of Ga$_{+3}$, Sb$^{+3}$, Fe$^{+2}$, or La$^{+3}$ for Ti$^{+4}$) is prepared by mechanically alloying Ba, Ti and A in a ball mill. The alloy is packed into a copper tube, which is then sealed.

Figure 3B:
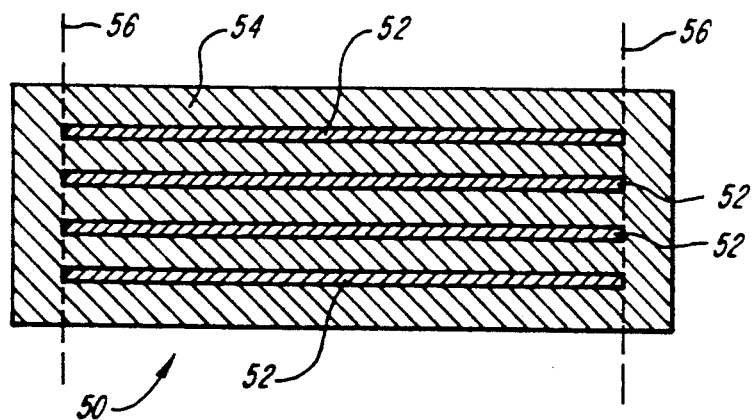

The packed tube is deformed into a round cross-section wire, by extrusion, or wire drawing (or a combination of extrusion and wire drawing). The wire is then rolled into a tape (rectangular cross section). Pieces of the tape are then stacked and packed into a copper tube with a square-cross-section center hole. This tube is sealed, and then deformed by extrusion or rolling into a multifilamentary wire. The process of bundling and deforming is repeated until a composite structure, designated 50 in FIG. 3b, having the desired number of filaments is obtained. As shown, the composite structure includes a plurality of spaced alloy layers 52, separated and surrounded by copper 54. The copper at the edges of the rectangular cross-section can then be mechanically removed (along dashed lines 56) so as to isolate the copper layers from each other (FIG. 3b).

The multifilamentary wire is then oxidized in an atmosphere with an oxygen partial pressure below $1 \times 10^{-11}$ atm at a temperature above 700° C., so as to form a multi-layer Cu/A-doped BaTiO$_3$ laminated composite (where A is an acceptor dopant).

EXAMPLE 8

A Ba$_1$Ti$_1$ alloy may be prepared by mechanically alloying Ba and Ti in an attritor mill. A small amount (<5 mole percent) of the Ti is added in the form of TiO$_2$, so as to enhance the mechanical alloying. The alloy is packed into a silver tube, which is then sealed.

The packed tube is deformed into a hexagonal cross-section wire, by extrusion, or wire drawing (or a combination of extrusion and wire drawing). The wire is cut up into pieces, which are then bundled and packed into another silver tube. This tube is sealed, and then deformed by extrusion, drawing, or swaging (or a combination of the above processes) into a multifilamentary wire. The process of rebundling and deforming is repeated until the desired number of filaments is obtained.

The multifilamentary wire is then oxidized in a pure oxygen atmosphere at a temperature below 931° C., so as to form a multifilament Ag/BaTiO$_3$ composite.

EXAMPLE 9

A Ba$_1$Fe$_{12}$ alloy may be prepared by mechanically alloying Ba and Fe in a ball mill. The alloy is packed into a silver tube, which is then sealed.

The packed tube is deformed into a round cross-section wire, by extrusion, or wire drawing (or a combination of extrusion and wire drawing). The wire is then rolled into a tape (rectangular cross section). The tape is cut up into pieces, which are then stacked and packed into a silver tube with a square-cross-section center hole. This tube is sealed, and then deformed by extrusion or rolling into a multifilamentary wire. The process of rebundling and deforming is repeated until the desired number of filaments is obtained. The silver on one pair of edges of the rectangular cross-section can then be mechanically removed so as to isolate the silver layers from each other.

The multifilamentary wire is then oxidized in a pure oxygen atmosphere at a temperature below 931° C., so as to form a multi-layer Ag/BaFe$_{12}$O$_{19}$ laminated composite.

EXAMPLE 10

A Ba$_1$Ti$_1$ alloy may be prepared by mechanically alloying Ba and Ti in a ball mill. The alloy is packed into a silver-paladium alloy (Ag$_{0.8}$Pd$_{0.2}$) tube, which is then sealed.

The packed tube is deformed into a round cross-section wire, by extrusion, or wire drawing (or a combination of extrusion and wire drawing). The wire is then rolled into a tape (rectangular cross section). The tape is cut up into pieces, which are then stacked and packed into a silver-paladium alloy (Ag$_{0.8}$Pd$_{0.2}$) tube with a square-cross-section center hole. This tube is sealed, and then deformed by extrusion or rolling into a multifilamentary wire. The process of rebundling and deforming is repeated until the desired number of filaments is obtained. The silver-paladium alloy on one pair of edges of the rectangular cross-section can then be mechanically removed so as to isolate the silver-paladium layers from each other.

The multifilamentary wire is then oxidized in a pure oxygen atmosphere at a temperature below 1100° C., so as to form a multi-layer Ag—Pd/BaTiO$_3$ laminated composite.

EXAMPLE 11

A metal alloy precursor containing the elements Ba, Ti and Ag, in the molar ratio Ba:Ti:Ag=1:1:x (where x>0), may be first prepared by mechanical alloying, melt spinning or sputtering. The alloy is then exposed to a series of heat treatment steps during which the element Ag remains noble (unoxidized). Ag remains noble at temperatures above 200° C. in an environment with an oxygen partial pressure below 1 atmosphere.

The precursor is first exposed to an oxidizing environment which will cause the elements Ba, and Ti to diffuse outward through the alloy at a rapid rate (relative to oxygen inward diffusion) and react with the incoming oxygen to form the oxides BaO and TiO$_2$. This step will create a layer that has a relatively high concentration of oxide particles (BaO and TiO$_2$) and a relatively low concentration of the noble element, Ag.

The precursor may then be exposed to an environment which causes the oxygen to diffuse inward at a rate that is rapid relative to the rate of diffusion of Ba, and Ti outward. This step will create a layer that is rich in noble element, Ag, and contain relatively few particles of BaO, TiO$_2$. The low concentration of oxide particles is due to the relatively slow outward diffusion of Ba, and Ti during this cycle, and to the depletion of these elements in this layer during the previous oxidation cycle.

After a number of cycles have been conducted to form the desired number of layers, the body may be further heated to transform the individual oxides BaO, TiO$_2$ into the desired ceramic oxide, BaTiO$_3$. However, during this further heating, the body will retain its laminar structure since the individual oxides species BaO, TiO$_2$ are too large to allow for much diffusion into the Ag rich layers. Accordingly, after the conversion, the body will contain layers with a high concentration of ceramic oxide ($BaTiO_3$) alternating with layers containing a relatively large concentration of the noble metal, Ag.

Other embodiments are within the scope of the following claims.

What is claimed is:

1. A method of making a multi-layer dielectric, piezoelectric, electro-optic, or optical ceramic oxide device comprising the steps of:
   a. combining metallic elements in substantially the stoichiometric proportions needed to form said oxide to form an alloy;
   b. forming a multi-layer structure including a plurality of layers of said alloy with a conductive layer between each pair of adjacent layers of said alloy; and,
   c. oxidizing said layers of said alloy to transform said layers of said alloy into layers of said oxide.

2. The method of claim 1 wherein said elements combined in said stoichiometric proportions include titanium and either (a) barium or (b) lead and zirconium.

3. The method of claim 2 wherein said elements combined in said stoichiometric proportions include titanium and barium.

4. The method of claim 2 wherein the elements combined in said stoichiometric proportions include titanium, lead, and zirconium.

5. The method of claim 1 wherein said elements combined in said stoichiometric proportions include an element selected from the group consisting of column 1-A elements, column 2-A elements, column IV-A elements and column V-A elements.

6. The method of claim 1 wherein said elements combined in said stoichiometric proportions include a first element selected from the group consisting of column 1-A elements and column 2-A elements, and a second element selected from the group consisting of column IV-A elements and column V-A elements.

7. The method of claim 1 wherein said elements combined in said stoichiometric proportions include titanium and an element selected from the group consisting of lanthanum, barium, strontium, calcium, lead, niobium, magnesium, lithium, neodymium, bismuth, tin, and zirconium.

8. The method of claim 1 wherein said elements combined in said stoichiometric proportions include niobium and an element selected from the group consisting of barium, magnesium, lead, zinc, iron, tungsten, scandium, bismuth, nickel, potassium, germanium, lithium, strontium, and titanium.

9. The method of claim 1 wherein said elements combined in said stoichiometric proportions include tantalum and an element selected from the group consisting of scandium, lead, magnesium, barium, tin, zirconium and iron.

10. The method of claim 1 wherein said elements combined in said stoichiometric proportions include tungsten and an element selected from the group consisting of nickel, lead, scandium, magnesium, lithium and iron.

11. The method of claim 1 wherein said elements combined in said stoichiometric proportions include iron and an element selected from the group consisting of barium, calcium and strontium.

12. The method of claim 1 wherein said elements combined in said stoichiometric proportions include zinc and an element selected from the group consisting of bismuth, antimony, cobalt, manganese and chromium.

13. The method of claim 1 wherein said elements combined in said stoichiometric proportions include a dopant present in an amount not greater than 5 mole percent.

14. The method of claim 1 wherein said metallic elements include titanium and barium in substantially 1:1 stoichiometric proportions, and said oxide is barium titanate.

15. The method of claim 14 wherein the thickness of each of said layers of said alloy is less than about 20 microns.

16. The method of claim 15 wherein said thickness is less than about 5 microns.

17. The method of claim 1 wherein said conductive layer is a noble metal.

18. The method of claim 17 wherein said conductive layer is silver.

19. The method of claim 1 including the step of combining said metallic elements with a dopant prior to said oxidizing.

20. The method of claim 1 wherein said oxidizing is accomplished at a temperature not more than about 1200° C.

21. The method of claim 1 wherein said temperature is not more than about 900° C.

22. The method of claim 1 including the step of surrounding said multi-layer structure with a noble metal prior to said oxidizing.

23. The method of claim 22 wherein said noble metal is silver.

24. A ceramic oxide material prepared according to the method of claim 1.

25. The method of claim 1 wherein said step of combining includes a process selected from the group consisting of mechanical alloying, melt alloying, vapor deposition and sputtering.

26. The method of claim 1 including the steps of placing said combined metallic elements into a tube of a noble metal, sealing said tube, and mechanically deforming said sealed tube to reduce the cross-section thereof.

27. The method of claim 26 including the step of forming a multi-layer structure including a plurality of lengths of mechanically deformed and sealed tube, and thereafter mechanically deforming said multi-layer structure to form said multi-layer structure.

28. The method of claim 26 wherein said mechanically deformed and sealed tube is generally circular in cross-section and said multi-layer structure is multi-filamentary.

29. The method of claim 26 wherein said sealed tube is mechanically deformed to produce a tape of generally rectangular cross-section, and lengths of said tape are stacked to provide a multi-layer structure of generally rectangular cross-section.

30. The method of claim 1 including the steps of depositing said layers onto a substrate by a vapor state process.

31. The method of claim 30 wherein said vapor state process is selected from the group consisting of evaporation, sputtering, and laser ablation.

32. The method of claim 1 wherein said step of oxidizing is conducted with an oxidizing atmosphere of a solid, liquid, or gaseous phase, or a combination of solid, liquid, or gaseous phases.

33. The method of claim 1 wherein said step of oxidizing is conducted with an applied potential in electric field.

34. The method of claim 1 wherein said step of oxidizing includes oxidation of solid, liquid, and gaseous metal alloys.

* * * * *